United States Patent
Patel et al.

(10) Patent No.: US 10,461,067 B2
(45) Date of Patent: Oct. 29, 2019

(54) THERMALLY ENHANCED PACKAGE TO REDUCE THERMAL INTERACTION BETWEEN DIES

(71) Applicant: GLOBALFOUNDRIES Inc., Grand Cayman (KY)

(72) Inventors: Janak Patel, South Burlington, VT (US); Subramanian Srikanteswara Iyer, Los Angeles, CA (US); Daniel Berger, New Paltz, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/799,600

(22) Filed: Oct. 31, 2017

(65) Prior Publication Data
US 2018/0068993 A1   Mar. 8, 2018

Related U.S. Application Data

(62) Division of application No. 15/205,496, filed on Jul. 8, 2016, now Pat. No. 9,859,262.

(51) Int. Cl.
*H01L 25/18* (2006.01)
*H01L 21/48* (2006.01)
(Continued)

(52) U.S. Cl.
CPC .......... *H01L 25/18* (2013.01); *H01L 21/4803* (2013.01); *H01L 21/4871* (2013.01); *H01L 23/04* (2013.01); *H01L 23/3675* (2013.01); *H01L 23/3736* (2013.01); *H01L 23/427* (2013.01); *H01L 24/32* (2013.01); (Continued)

(58) Field of Classification Search
CPC ....... H01L 23/42–4338; H01L 25/0655–0657; H01L 23/38; H01L 35/30; H01L 23/34; H01L 21/4871; H01L 21/4803; H01L 23/427; H01L 33/645; H01L 23/4012; H01L 33/647–648
See application file for complete search history.

(56) References Cited

U.S. PATENT DOCUMENTS

| 6,343,643 | B1 | 2/2002 | Bollesen |
| 7,436,059 | B1 * | 10/2008 | Ouyang ................. H01L 23/34 257/712 |

(Continued)

FOREIGN PATENT DOCUMENTS

| CN | 104716109 A | 6/2015 |
| JP | S58176959 A | 10/1983 |

(Continued)

OTHER PUBLICATIONS

Office Action for related Taiwanese Patent Application No. 106105908 dated Dec. 19, 2017, 11 Pages.

(Continued)

*Primary Examiner* — Nelson Garces
(74) *Attorney, Agent, or Firm* — Ditthavong & Steiner, P.C.

(57) ABSTRACT

A method of reducing heat flow between IC chips and the resulting device are provided. Embodiments include attaching plural IC chips to an upper surface of a substrate; forming a lid over the IC chips; and forming a slit through the lid at a boundary between adjacent IC chips.

7 Claims, 4 Drawing Sheets

(51) Int. Cl.
*H01L 25/065* (2006.01)
*H01L 23/04* (2006.01)
*H01L 23/367* (2006.01)
*H01L 23/373* (2006.01)
*H01L 23/427* (2006.01)
*H01L 23/00* (2006.01)
*H01L 25/00* (2006.01)

(52) U.S. Cl.
CPC .......... *H01L 24/83* (2013.01); *H01L 25/0657* (2013.01); *H01L 25/50* (2013.01); *H01L 2224/16145* (2013.01); *H01L 2224/16225* (2013.01); *H01L 2224/32245* (2013.01); *H01L 2224/73253* (2013.01); *H01L 2225/06513* (2013.01); *H01L 2924/1431* (2013.01); *H01L 2924/1434* (2013.01); *H01L 2924/1436* (2013.01); *H01L 2924/15311* (2013.01)

(56) References Cited

U.S. PATENT DOCUMENTS

| | | |
|---|---|---|
| 2011/0170965 A1 | 7/2011 | Novak et al. |
| 2013/0043581 A1* | 2/2013 | Negoro .................. H01L 23/13 257/712 |
| 2013/0083485 A1* | 4/2013 | Tong .................... H01L 23/427 361/700 |
| 2015/0162307 A1 | 6/2015 | Chen et al. |

FOREIGN PATENT DOCUMENTS

| | | |
|---|---|---|
| JP | H0917919 A | 1/1997 |
| TW | 201327740 A | 7/2013 |
| TW | 201330218 A | 7/2013 |

OTHER PUBLICATIONS

Office Action for the related Taiwanese Patent Application. 106105908, dated May 9, 2018, 9 pages.

* cited by examiner

BACKGROUND

THERMALLY ENHANCED PACKAGE TO REDUCE THERMAL INTERACTION BETWEEN DIES

RELATED APPLICATIONS

The present application is a Divisional of application Ser. No. 15/205,496, filed on Jul. 8, 2016, which is incorporated herein by reference in its entirety.

TECHNICAL FIELD

The present disclosure relates to the manufacture of semiconductor devices, such as integrated circuits (ICs). The present disclosure is particularly applicable to forming semiconductor packages with chips mounted close to each other, particularly for the 14 nanometer (nm) technology node and beyond.

BACKGROUND

In a 2.5D package, multiple IC chips (e.g., a logic chip, a memory stack, etc.) are mounted close together to improve performance, bandwidth and/or functionality. Since multiple IC chips are close to each other, they are thermally coupled together. If one of the IC chips dissipates more power than the others, heat may flow from the high power IC chip to a lower power IC chip. The IC fabrication technology for each IC could be different, and hence the junction temperature specification can be different as well depending on technology, functionality, performance and bandwidth. The lower power IC could have a lower junction temperature specification. As a result, thermal management of heat generated in the 2.5D package becomes challenging.

For example, FIG. 1 illustrates heat flow in a package due to thermal interaction between IC chips. In FIG. 1, a substrate 101, with an upper surface and a lower surface, has solder balls 103 metallurgically bonded to a solder ball receiving area on the lower surface of the substrate 101. IC chips (e.g., a logic chip 105 and a memory stack 107) are attached to the upper surface of the substrate 101 by controlled collapse chip connection (C4) balls 109 via an interposer 108. The logic chip 105 and the memory stack 107 are mounted on the interposer 108 with micro-bumps 106. A lid 111 is formed over the logic chip 105 and the memory stack 107. The lid 111 is thermally connected to the logic chip 105 and the memory stack 107 by a thermal interface material (TIM1) 113. The lid 111 also includes lid feet in mechanical contact with the perimeter of the upper surface of the substrate by an adhesive 115. A heat sink 117 is formed over the lid 111. The heat sink 117 is thermally connected to the lid 111 by TIM2 119. Arrows 121 represent heat flow through the package. As illustrated, though the heat sink 117 includes a plurality of fins, heat generated within the package continues to flow between the logic chip 105 and the memory stack 107. As a result, the semiconductor devices tend to overheat or fail because of insufficient heat transfer.

A need therefore exists for methodology enabling formation of a semiconductor packaged with reduced thermal interaction between the IC chips and the resulting device.

SUMMARY

An aspect of the present disclosure is forming a slit through a semiconductor package lid at a boundary between a logic chip and a memory stack.

Another aspect of the present disclosure is forming a semiconductor package with at least one vertical heat pipe in direct thermal contact with an IC chip and a heat sink.

Another aspect of the present disclosure is a semiconductor package with a lid having a slit at a boundary between a logic chip and a memory stack.

Another aspect of the present disclosure is a semiconductor package with at least one vertical heat pipe in direct thermal contact with an IC chip and a heat sink.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: attaching plural IC chips to an upper surface of a substrate; forming a lid over the IC chips; and forming a slit through the lid at a boundary between adjacent IC chips.

Aspects of the present disclosure include the IC chips including: a logic chip; and at least one memory stack adjacent the logic chip. Further aspects include a method for forming the slit by: punch and die at a boundary between the logic chip and a memory stack. Other aspects include forming a slit between the logic chip and each memory stack. Additional aspects include forming a heat sink over the lid; and forming at least one vertical heat pipe through the heat sink and the lid, down to the IC chips, wherein each vertical heat pipe is in direct thermal contact with an IC chip and the heat sink.

Another aspect includes a method for forming the vertical heat pipes by: forming co-axial holes in the lid and the heat sink; and inserting the vertical heat pipes through the holes for direct thermal contact with the IC and the heat sink. Further aspects include thermally connecting the lid to the IC chips by a first thermal interface material (TIM1); and thermally connecting the heat sink to the lid by a second thermal interface material (TIM2), wherein a length of the vertical heat pipes equals a sum of a thickness of TIM1, a thickness of the lid, a thickness of TIM2, and a height of the heat sink. Other aspects include the vertical heat pipes including copper (Cu). Additional aspects include a diameter of each vertical heat pipe ranging from 1 millimeter (mm) to a width of the IC chip with which it is in thermal contact. Further aspects include the vertical heat pipes having conductivity in only one direction.

A further aspect of the present disclosure is a device including: plural IC chips attached to an upper surface of a substrate; a lid over the IC chips; and a slit through the lid at a boundary between adjacent IC chips.

Aspects of the device include the IC chips including: a logic chip; and at least one memory stack adjacent the logic chip. Other aspects include the slit formed at a boundary between the logic chip and a memory stack. Further aspects include a slit formed between the logic chip and each memory stack. Another aspect includes a heat sink over the lid; and at least one vertical heat pipe through the heat sink and the lid, down to the IC chips, wherein each vertical heat pipe is in direct thermal contact with an IC chip and the heat sink. Additional aspect includes a TIM1 between the lid and the IC chips; and a TIM2 between the heat sink and the lid, wherein a length of the vertical heat pipes equals a sum of a thickness of TIM1, a thickness of the lid, a thickness of TIM2, and a height of the heat sink. Further aspects include the vertical heat pipes including Cu. Another aspect includes a diameter of each vertical heat pipe ranging from 1 mm to a width of the IC chip with which it is in thermal contact. Additional aspect includes the vertical heat pipes having conductivity in only one direction.

Another aspect of the present disclosure is a method including: attaching IC chips, including a logic chip and at least one memory stack adjacent the logic chip, to an upper surface of a substrate; thermally connecting a lid to an upper surface of the IC chips by a TIM1; forming a slit through the lid by punch and die at a boundary between the logic chip and each memory stack; thermally connecting a heat sink to the lid by a TIM2; forming at least one co-axial hole in the lid and the heat sink; and inserting a vertical heat pipe through each hole for direct thermal contact with an IC chip and the heat sink, wherein a length of the vertical heat pipes equals a sum of a thickness of TIM1, a thickness of the lid, a thickness of TIM2, and a height of the heat sink, a diameter of each vertical heat pipe ranges from 1 mm to a width of the IC chip with which it is in thermal contact, and the vertical heat pipes have conductivity in only one direction.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of thermal interaction between IC chips attendant upon forming a 2.5D semiconductor package with memory stacks close to a logic chip. In accordance with embodiments of the present disclosure, thermal interaction between IC chips can be avoided by forming a slit in the module lid at IC chip boundaries to stop heat flow from one chip to another through the lid. Correspondingly, heat flow from one IC chip to another through a heat sink base can be avoided by forming at least one vertical heat pipe that is inserted through co-axial holes in the heat sink and the lid for direct thermal contact with an IC chip.

Methodology in accordance with embodiments of the present disclosure includes attaching plural IC chips to an upper surface of a substrate and forming a lid over the IC chips. A slit is formed through the lid at a boundary between adjacent IC chips.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
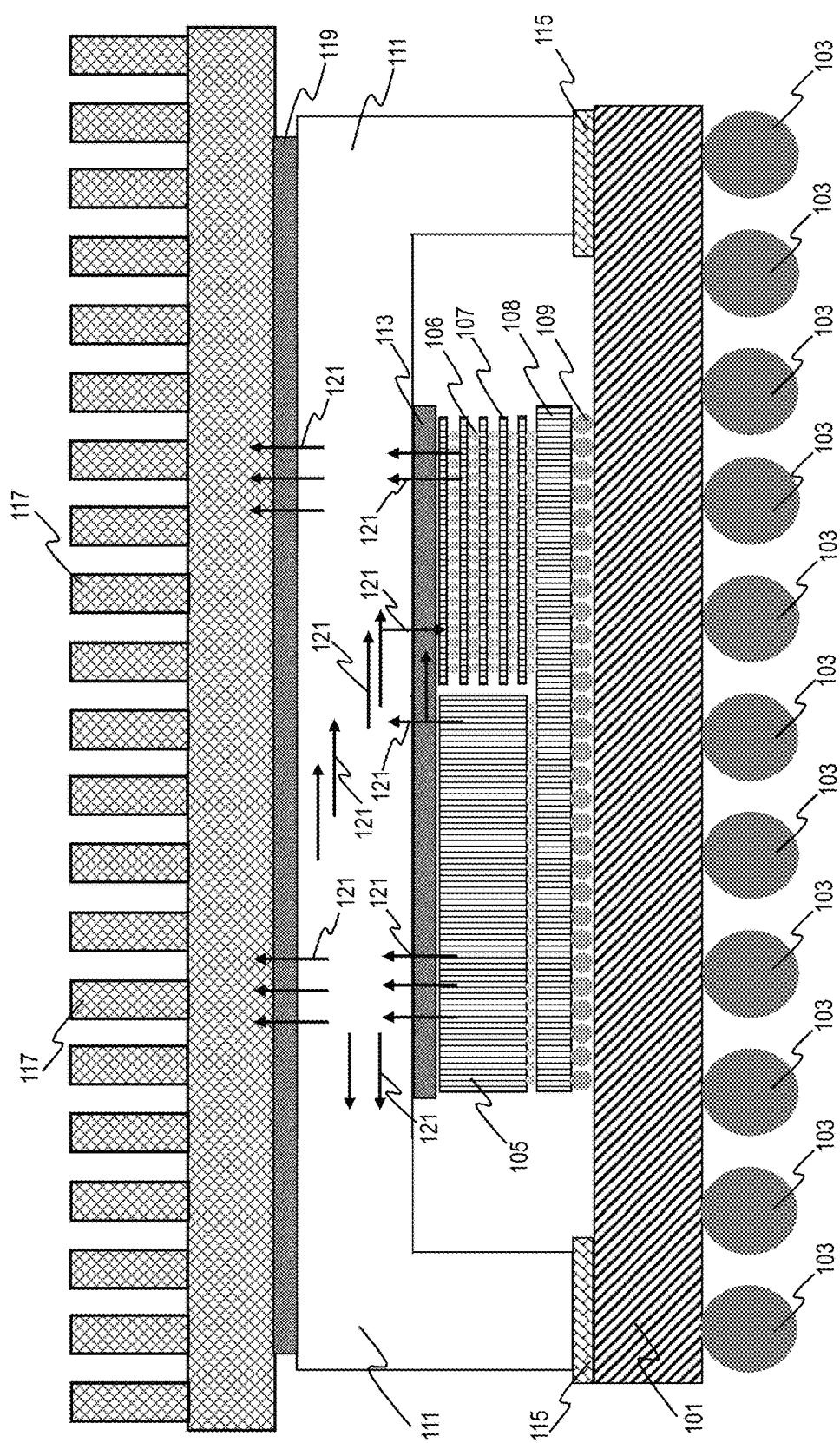
FIG. 1 schematically illustrates heat flow in a semiconductor package with adjacent IC chips.
Figure 2:
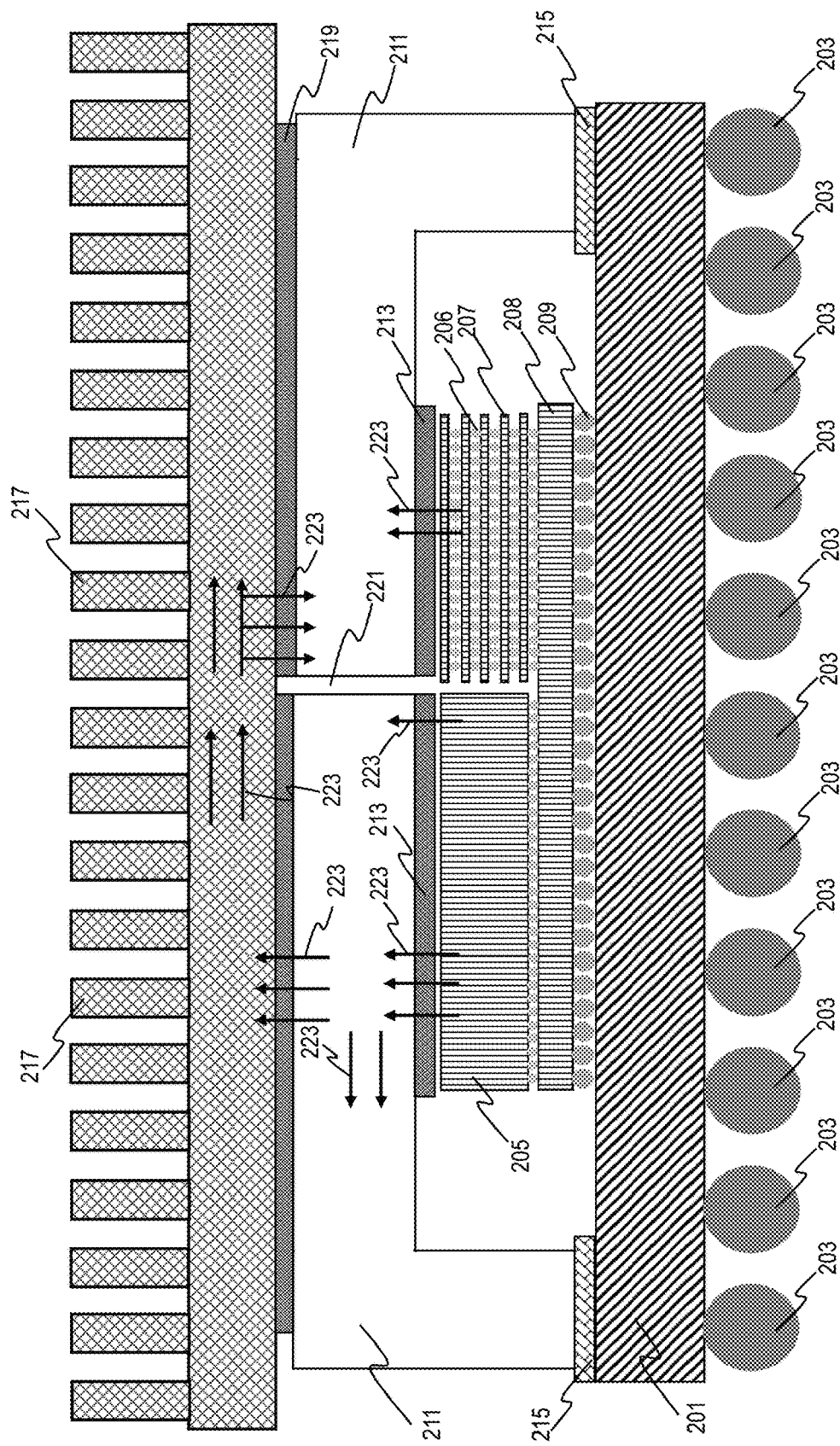
FIG. 2 schematically illustrates a semiconductor package with a slit at a boundary between adjacent IC chips, in accordance with an exemplary embodiment.

FIG. 2 schematically illustrates a semiconductor package with a slit at a boundary between adjacent IC chips, in accordance with an exemplary embodiment. Similar to the conventional semiconductor package of FIG. 1, FIG. 2 includes a substrate 201 with an upper surface and a lower surface. Solder balls 203 are metallurgically bonded to solder ball receiving areas in the lower surface of the substrate 201. A logic chip 205 and a memory stack 207 are attached to the upper surface of the substrate 201 by C4 balls 209 via an interposer 208. The logic chip 205 and the memory stack 207 are mounted on the interposer 208 with micro-bumps 206. A lid 211 is formed over the logic chip 205 and the memory stack 207. The lid 211 is thermally connected to the logic chip 205 and the memory stack 207 by TIM1 213. The TIM1 213 is separated at the boundary right under the slit to isolate the thermal path. The lid 211 also includes lid feet in mechanical contact with a perimeter of the upper surface of the substrate by an adhesive 215. FIG. 2 differs from FIG. 1 in that a slit 221 is formed through the lid 211 at a boundary between the logic chip 205 and the memory stack 207, for example by punch and die. The punch and die is either integrated in the lid 211 fabrication tooling or in a separate tooling. Although only one memory stack is illustrated in FIG. 2 for illustrative convenience, a second memory stack (e.g., a hybrid memory cube (HMC) or a high bandwidth memory (HBM)) could be present on the other side of the custom logic die (e.g., an application-specific integrated circuit (ASIC)). A similar slit in the lid may be formed between the logic chip and any additional memory stack. The width of the slit 221 is at least as large as the physical space separation between the IC chips such that there is no direct thermal conduction at the slit location. The length of the slit 221 needs to be at least the length of the larger IC chip on the either side. As illustrated by arrows 223, the slit 221 prevents heat flow from the logic chip 205 to the memory stack 207 and vice-versa through the lid 211. In such manner, the slit 221 avoids thermal interaction between the logic chip 205 and the memory stack 207. In addition, a heat sink 217 is formed over the lid 211, and is thermally connected to the lid 211 by TIM2 219.

Figure 3:
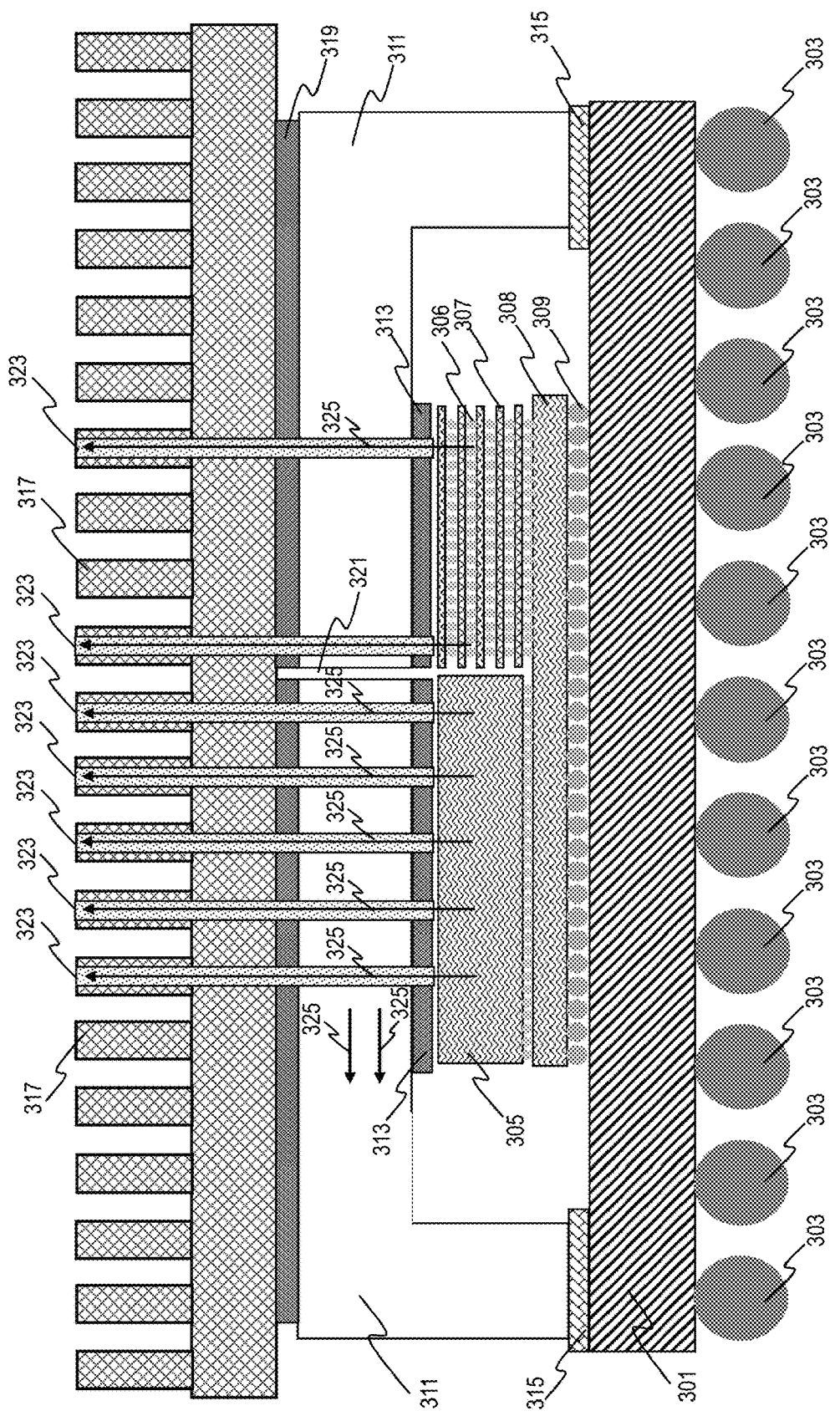
FIG. 3 schematically illustrates a semiconductor package with both a slit at a boundary between adjacent IC chips and a vertical heat pipe in direct thermal contact with an IC chip and a heat sink, in accordance with an exemplary embodiment.

FIG. 3 schematically illustrates a semiconductor package with both a slit at a boundary between adjacent IC chips and a vertical heat pipe in direct thermal contact with an IC chip and a heat sink, in accordance with an exemplary embodiment. FIG. 3 includes the same elements as in FIG. 2. Specifically, solder balls 303 are metallurgically bonded to the solder balls receiving areas in the lower surface of substrate 301. A logic chip 305 and a memory stack 307 are attached to the upper surface of the substrate 301 by C4 balls 309 via an interposer 308. The logic chip 305 and the memory stack 307 are mounted on the interposer 308 with micro-bumps 306. A lid 311 is formed over the logic chip 305 and the memory stack 307 and is thermally connected by TIM1 313. The lid 311 also includes lid feet in mechanical contact with a perimeter of the upper surface of the substrate 301 by an adhesive 315. A slit 321 is formed through the lid at a boundary between the logic chip 305 and the memory stack 307, e.g., by punch and die. The punch and die is either integrated in the lid 311 fabrication tooling or in a separate tooling. A heat sink 317 is formed over the lid 311, and is thermally connected to the lid 311 by TIM2 319. The difference between FIG. 3 and FIG. 2 is that co-axial holes are formed through the lid 311 and the heat sink 317. Then, prefabricated vertical heat pipes 323 are inserted through the co-axial holes for direct thermal contact between the heat sink 317 and both the logic chip 305 and the memory stack 307. The vertical heat pipes 323 prevent heat flow from the logic chip 305 to the memory stack 307 and vice-versa through the heat sink base. The vertical heat pipes 323 are formed of Cu or any other metal. The length of the vertical heat pipes 323 equals a sum of the thickness of TIM1, the thickness of the lid, the thickness of TIM2, and the height of the heat sink. The diameter of each vertical heat pipe 323 ranges from 1 mm to a width of the IC chip with which it is in thermal contact. The vertical heat pipes 323 have conductivity in only one direction. As shown by arrows 325, heat flows from the logic chip away from the memory stack.

Figure 4:
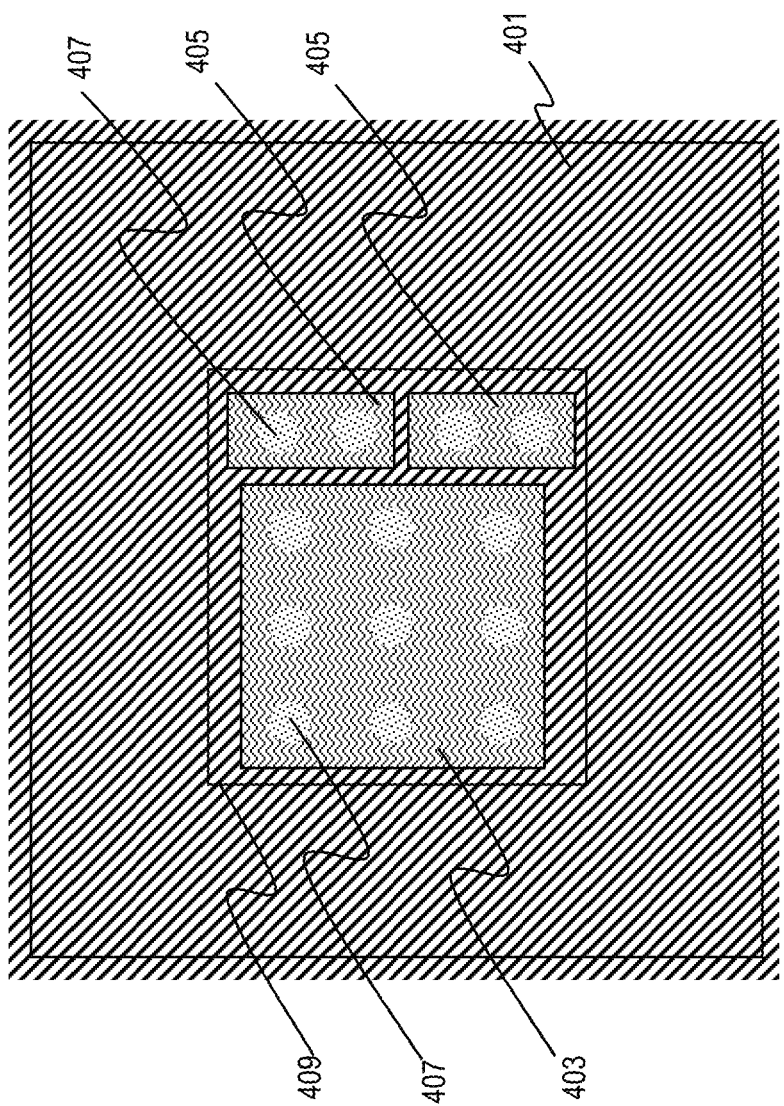
FIG. 4 schematically illustrates a top down view of a 2.5D package of FIG. 3, in accordance with an exemplary embodiment.

FIG. 4 schematically illustrates a top down view of the 2.5D package of FIG. 3, in accordance with an exemplary embodiment. In FIG. 4, the number of the vertical heat pipes 407 shown thermally connected to a logic chip 403 is higher than the number of the vertical heat pipes 407 shown thermally connected to a memory stack 405. However, the number of the vertical heat pipes 407 on each of the logic chip 403 and the memory stack 405 is based on the diameter of the vertical heat pipes, the size of the IC chips and the spacing rules for hole fabrication technology. The thermal conductivity of the vertical heat pipes 407 is 10,000 times higher than Cu. In addition, the vertical heat pipes 407 have conductivity in only one direction; therefore the end of the vertical heat pipes 407 at the logic chip 403 and the memory stack 405 have a higher temperature, and the other end is at a lower temperature. Further, the inherent very high thermal conductivity of the vertical heat pipes 407 allows effective heat dissipation. Accordingly, the heat from the logic chip 403 and the memory stack 405 flows to the top of the heat sink quicker and is dissipated speedily as the temperature delta between the heat sink top and ambient air is sufficiently large. With the slit and vertical heat pipes in direct thermal contact with both the IC chips and the heat sink, the thermal interaction between IC chips is reduced. A carefully designed vertical heat pipe arrangement can reduce the thermal solution size by almost 25%.

The embodiments of the present disclosure can achieve several technical effects, such as, reduced thermal interaction between IC chips, smaller and lighter thermal solution size, faster heat flow from IC chips to the top of heat sink, faster heat dissipation, etc. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   integrated circuit (IC) chips, comprising a logic chip and at least one memory stack adjacent the logic chip, attached to an upper surface of a substrate;
   a lid thermally connected to an upper surface of the IC chips by a first thermal interface material (TIM1);
   a slit formed through the lid by punch and die at a boundary between the logic chip and each memory stack;
   a heat sink thermally connected to the lid by a second thermal interface material (TIM2);
   at least one co-axial hole formed in the lid and the heat sink; and
   a vertical heat pipe extending through each co-axial hole for direct thermal contact with an IC chip and the heat sink.

2. The device according to claim 1, wherein a length of the vertical heat pipes equals a sum of a thickness of TIM1.

3. The device according to claim 2, wherein a thickness of the lid, a thickness of TIM2, and a height of the heat sink, a diameter of each vertical heat pipe ranges from 1 millimeter (mm) to a width of the IC chip with which it is in thermal contact.

4. The device according to claim 3, wherein the vertical heat pipes have conductivity in only one direction.

5. A device comprising:
   integrated circuit (IC) chips, comprising a logic chip and at least one memory stack adjacent the logic chip, attached to an upper surface of a substrate;
   a lid thermally connected to an upper surface of the IC chips by a first thermal interface material (TIM1);
   a slit formed through the lid by punch and die at a boundary between the logic chip and each memory stack; and
   a heat sink formed over the lid, the heat sink having vertical pipes penetrating the heat sink and reaching the IC chips and the vertical pipes in direct thermal contact with the IC chips and heat sink,
   wherein the vertical heat pipes extend through co-axial holes in the lid and the heat sink.

6. The device according to claim 5, wherein the vertical heat pipes have conductivity in only one direction.

7. The device according to claim 5, wherein the vertical heat pipes comprise copper (Cu).

* * * * *